US010309759B2

(12) United States Patent
Li et al.

(10) Patent No.: US 10,309,759 B2
(45) Date of Patent: Jun. 4, 2019

(54) METHOD AND APPARATUS FOR ADJUSTING EXCITATION VOLTAGE OF FINGERPRINT DETECTION CHIP

(71) Applicant: BYD COMPANY LIMITED, Shenzhen (CN)

(72) Inventors: Zhengang Li, Shenzhen (CN); Kunping Xu, Shenzhen (CN); Yun Yang, Shenzhen (CN)

(73) Assignee: BYD COMPANY LIMITED, Shenzhen (CN)

( * ) Notice: Subject to any disclaimer, the term of this patent is extended or adjusted under 35 U.S.C. 154(b) by 1 day.

(21) Appl. No.: 15/574,053

(22) PCT Filed: Jun. 8, 2016

(86) PCT No.: PCT/CN2016/085234
§ 371 (c)(1),
(2) Date: Nov. 14, 2017

(87) PCT Pub. No.: WO2016/197940
PCT Pub. Date: Dec. 15, 2016

(65) Prior Publication Data
US 2018/0299248 A1 Oct. 18, 2018

(30) Foreign Application Priority Data
Jun. 10, 2015 (CN) .......................... 2015 1 0315189

(51) Int. Cl.
*G01B 7/28* (2006.01)
*G06K 9/00* (2006.01)
(Continued)

(52) U.S. Cl.
CPC ................. *G01B 7/28* (2013.01); *G01D 5/14* (2013.01); *G06K 9/0002* (2013.01); *G01R 27/2605* (2013.01)

(58) Field of Classification Search
CPC ... G01B 7/00; G01B 7/28; G06K 9/00; G06K 9/00006; G06K 9/00013; G06K 9/0002;
(Continued)

(56) References Cited

U.S. PATENT DOCUMENTS 9,360,975 B2 * 6/2016 Heim ..................... G06F 3/0213
9,442,534 B2 * 9/2016 Burger ................. H03K 17/955
(Continued)

FOREIGN PATENT DOCUMENTS

AU 2014100526 A4 6/2014
CN 102782700 A 11/2012
(Continued)

OTHER PUBLICATIONS

The World Intellectual Property Organization (WIPO) International Search Report for PCT/CN2016/085234 dated Sep. 2, 2016 2 Pages.

*Primary Examiner* — Hoai-An D. Nguyen
(74) *Attorney, Agent, or Firm* — Anova Law Group, PLLC

(57) ABSTRACT

The present disclosure provides a method and an apparatus for adjusting an excitation voltage of a fingerprint detection chip and a fingerprint detection chip. The method for adjusting an excitation voltage of a fingerprint detection chip includes: S1, transmitting an excitation signal to the metal ring by the signal transmitting unit, so as to detect a capacitance value of a coupling capacitance formed between the plurality of detection units in the second detection area and the metal ring; or enabling the metal ring grounded, and applying an excitation signal to the plurality of detection units in the second detection area by the signal transmitting unit, so as to detect a capacitance value of a coupling capacitance formed between the plurality of detection units in the second detection area and the metal ring; and S2, adjusting an excitation voltage of the first detection area according to the capacitance value of the coupling capaci- (Continued)

tance formed between the plurality of detection units in the second detection area and the metal ring.

17 Claims, 4 Drawing Sheets

(51) Int. Cl.
*G01R 27/26* (2006.01)
*G01D 5/14* (2006.01)

(58) Field of Classification Search
CPC ........... G06K 9/00067; G06K 9/00073; G06K 9/0008; G06K 9/00093; G06K 9/001; G06K 9/00375; G01D 5/00; G01D 5/12; G01D 5/14; G01D 5/24; G01D 5/2405; G01D 5/241; G01D 5/2412; G01D 5/2417; G01R 27/26; G01R 27/2605; H03K 17/00; H03K 17/94; H03K 17/945; H03K 17/955; G01L 1/00; G01L 1/14; G01L 1/142; G01L 1/146
USPC ....... 324/600, 649, 658, 660, 661, 663, 671, 324/686, 519, 548; 345/173, 174; 702/47, 52

See application file for complete search history.

(56) References Cited

U.S. PATENT DOCUMENTS

| 2013/0231046 | A1  | 9/2013  | Pope et al. |
|---|---|---|---|
| 2015/0195007 | A1* | 7/2015  | He ...................... H04B 5/0012 455/41.1 |
| 2015/0277618 | A1* | 10/2015 | Bulea .................... G06F 3/0418 345/174 |
| 2017/0330014 | A1* | 11/2017 | Ramberg ............. G06K 9/0002 |
| 2018/0005001 | A1* | 1/2018  | Nilsson .................... G01D 5/24 |

FOREIGN PATENT DOCUMENTS

| CN | 103376970 A | 10/2013 |
|---|---|---|
| CN | 103745194 A | 4/2014 |
| CN | 103870817 A | 6/2014 |
| CN | 103902971 A | 7/2014 |
| CN | 104573649 A | 4/2015 |
| CN | 105447442 A | 3/2016 |
| EP | 2650823 A2  | 10/2013 |

* cited by examiner

METHOD AND APPARATUS FOR ADJUSTING EXCITATION VOLTAGE OF FINGERPRINT DETECTION CHIP

CROSS-REFERENCE TO RELATED APPLICATION

This application is a national phase entry under 35 U.S.C. § 371 of International Application No. PCT/CN2016/085234, filed on Jun. 8, 2016, which claims a priority to and benefits of Chinese Patent Application Serial No. 201510315189.8, filed with the State Intellectual Property Office of P. R. China on Jun. 10, 2015, the entire content of all of which is incorporated herein by reference

FIELD

The present disclosure relates to the fingerprint identification technology and, more particularly, to a method adjusting an excitation voltage of a fingerprint detection chip and an apparatus thereof.

BACKGROUND

With the continuous progress of science and technology, fingerprint identification applications are used more and more widely, which has become one of essential functions in upscale smart phones. At present, the fingerprint identification is realized by a capacitive fingerprint detection chip in the smart phone. The fingerprint detection chip consists of a plurality of detection units and is packaged by plastic. Technical requirements for plastic packaging are very high because the fingerprint detection is a precise detection. The surface thickness of the plastic package is generally required to be in a range of 100 microns to 200 microns, and an error tolerance of the surface thickness of the plastic package for the same type products is required to be lower than 2 micron.

If the package thickness is too thin, the contrast of a detected image is high, which may be out of range; if the package thickness is too thick, the contrast of the detected image may be so low that an imaging effect is poor. In both of the above-mentioned situations, a poor efficiency of fingerprint detection may occur. Specifically, a fingerprint detection example is shown in FIG. 1. As shown in FIG. 1, reference numeral 0 represents a finger, reference numeral 100' represents a fingerprint detection chip, reference numeral 113' represents a detection unit, reference numeral 200' represents a metal ring, and reference numeral 140' represents a plastic package area. When a finger 0 is located on the fingerprint detection chip 100', a coupling capacitance is generated between the finger 0 and the fingerprint detection chip 100'. The fingerprint detection chip 100' detects the fingerprint by detecting the coupling capacitance corresponding to each detection unit 113'. The capacitance formed between the finger 0 and each detection unit 113' of the fingerprint detection chip 100' may be different if the package thickness is inconsistent. The thinner a package area is, the larger a corresponding capacitance is; the thicker the package area is, the smaller the corresponding capacitance is. A top view of a package structure of the fingerprint detection chip 100' is shown in FIG. 2, in which the innermost area is the detection units 113' for detecting fingerprint capacitance, an area surrounding the detection units 113' is the fingerprint detection chip 100', and an area surrounding the fingerprint detection chip 100' is a metal ring 200'.

During operation of the fingerprint detection chip, a non-uniform package thickness may lead to different capacitance values corresponding to different detection units, such that difference between contrasts of images detected by the detection units is large, and all the detection units cannot operate in a desired state.

SUMMARY

Embodiments of the present disclosure are intended to solve at least one of the problems in the related art to at least some extent.

One objective of the present disclosure is to provide a method for adjusting an excitation voltage of a fingerprint detection chip, which makes all the detection units of the fingerprint detection chip operate in a desired state in a case of non-uniform package thickness.

Another objective of the present disclosure is to provide an apparatus for adjusting an excitation voltage of a fingerprint detection chip.

Another objective of the present disclosure is to provide a fingerprint detection chip.

To solve at least one of the above technical problems, a method for adjusting an excitation voltage of a fingerprint detection chip is provided according to a first aspect of embodiments of the present disclosure. The fingerprint detection chip has a signal transmitting unit, a first detection area and a second detection area, each of the first detection area and the second detection area has a plurality of detection units, the first detection area is configured to detect a fingerprint capacitance, a metal ring is located on the fingerprint detection chip, the metal ring at least partially covers the second detection area and the method includes: S1, transmitting an excitation signal to the metal ring by the signal transmitting unit, so as to detect a capacitance value of a coupling capacitance formed between the plurality of detection units in the second detection area and the metal ring; or enabling the metal ring grounded, and applying an excitation signal to the plurality of detection units in the second detection area by the signal transmitting unit, so as to detect a capacitance value of a coupling capacitance formed between the plurality of detection units in the second detection area and the metal ring; and S2, adjusting an excitation voltage of the first detection area according to the capacitance value of the coupling capacitance formed between the plurality of detection units in the second detection area and the metal ring.

With the method for adjusting an excitation voltage of a fingerprint detection chip according to embodiments of the present disclosure, by detecting the capacitance value of the coupling capacitance formed between the plurality of detection units in the second detection area and the metal ring and by adjusting the excitation voltage of the first detection area according to the capacitance value of the coupling capacitance, all the detection units of the fingerprint detection chip may operate in the desired state in the case of non-uniform package thickness, thereby improving efficiency of fingerprint detection, and further enhancing user's experience.

An apparatus for adjusting an excitation voltage of a fingerprint detection chip is provided according to a second aspect of embodiments of the present disclosure. The apparatus includes the fingerprint detection chip, a metal ring and a control module. The fingerprint detection chip comprises a signal transmitting unit, a first detection area and a second detection area, in which each of the first detection area and the second detection area has a plurality of detection units and the first detection area is configured to detect a fingerprint capacitance. The metal ring is located on the fingerprint detection chip, in which the metal ring at least partially covers the second detection area. The signal transmitting unit is configured to transmit an excitation signal to the metal ring, so as to detect a capacitance value of a coupling capacitance formed between the plurality of detection units in the second detection area and the metal ring, or is configured to apply an excitation signal to the plurality of detection units in the second detection area when the metal ring is grounded, so as to detect a capacitance value of a coupling capacitance formed between the plurality of detection units in the second detection area and the metal ring. The control module is configured to adjust an excitation voltage of the first detection area according to the capacitance value of the coupling capacitance formed between the plurality of detection units in the second detection area and the metal ring.

With the apparatus for adjusting an excitation voltage of a fingerprint detection chip according to embodiments of the present disclosure, by detecting the capacitance value of the coupling capacitance formed between the plurality of detection units in the second detection area and the metal ring and by adjusting the excitation voltage of the first detection area according to the capacitance value of the coupling capacitance, all the detection units of the fingerprint detection chip may operate in the desired state in the case of non-uniform package thickness, thereby improving efficiency of fingerprint detection, and further enhancing user's experience.

A fingerprint detection chip is provided according to a third aspect of embodiments of the present disclosure. The fingerprint detection chip includes a signal transmitting unit, a first detection area and a second detection area, in which each of the first detection area and the second detection area has a plurality of detection units, the first detection area is configured to detect a fingerprint capacitance; the signal transmitting unit is configured to transmit an excitation signal to a metal ring, so as to detect a capacitance value of a coupling capacitance formed between the plurality of detection units in the second detection area and the metal ring, or configured to apply an excitation signal to the plurality of detection units in the second detection area when the metal ring is grounded, so as to detect a capacitance value of a coupling capacitance formed between the plurality of detection units in the second detection area and the metal ring; the metal ring is located on the fingerprint detection chip and at least partially covers the second detection area.

With the fingerprint detection chip according to embodiments of the present disclosure, by detecting the capacitance value of the coupling capacitance formed between the plurality of detection units in the second detection area and the metal ring and by adjusting the excitation voltage of the first detection area according to the capacitance value of the coupling capacitance, all the detection units of the fingerprint detection chip may operate in the desired state in the case of non-uniform package thickness, thereby improving efficiency of fingerprint detection, and further enhancing user's experience.

Additional aspects and advantages of embodiments of present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of embodiments of the present disclosure will become apparent and more readily appreciated from the following descriptions made with reference to the drawings, in which.

DETAILED DESCRIPTION

Figure 1:
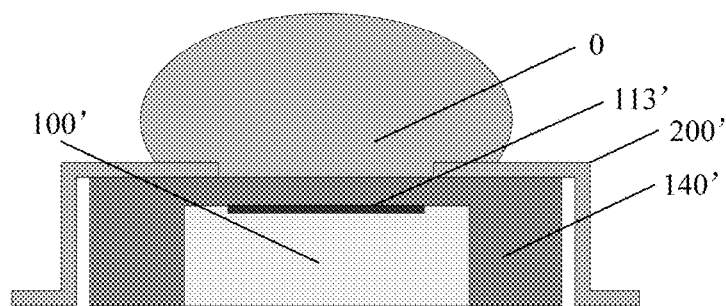
FIG. 1 is a schematic diagram of a fingerprint detection example in the related art.
Figure 2:
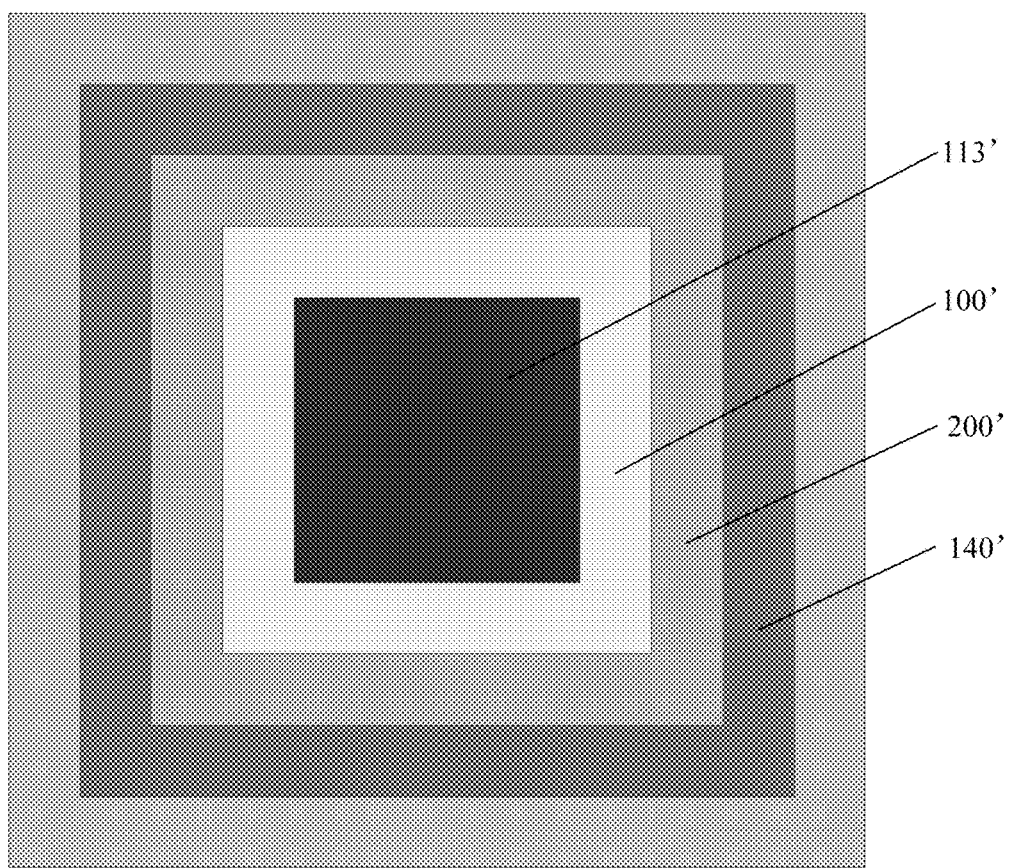
FIG. 2 is a top view of a package structure of a fingerprint detection chip in the related art.

Reference will be made in detail to embodiments of the present disclosure. The same or similar elements and the elements having same or similar functions are denoted by like reference numerals throughout the descriptions. The embodiments described herein with reference to drawings are explanatory, illustrative, and used to generally understand the present disclosure. The embodiments shall not be construed to limit the present disclosure.

A method and an apparatus for adjusting an excitation voltage of a fingerprint detection chip according to an embodiment of the present disclosure will be described in detail with reference to drawings as follows.

Figure 3:
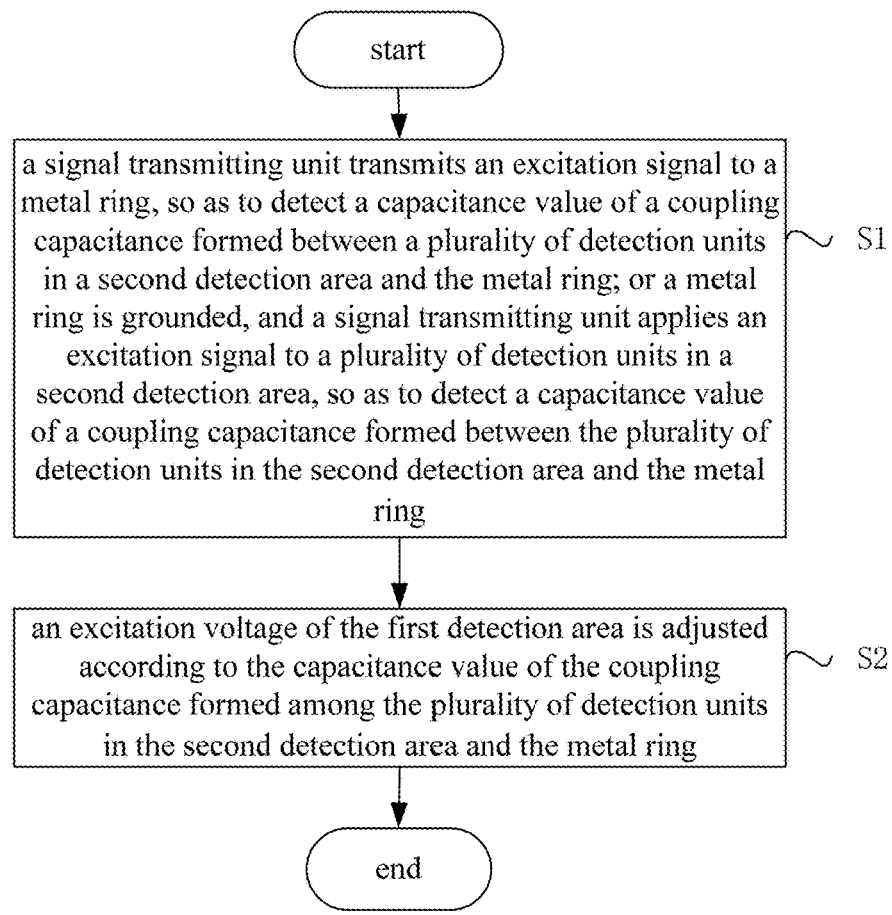
FIG. 3 is a flow chat of a method for adjusting an excitation voltage of a fingerprint detection chip according to an embodiment of the present disclosure.

FIG. 3 is a flow chat of a method for adjusting an excitation voltage of a fingerprint detection chip according to an embodiment of the present disclosure.

As shown in FIG. 3, the method for adjusting an excitation voltage of a fingerprint detection chip includes the following steps.

S1, a signal transmitting unit transmits an excitation signal to a metal ring, so as to detect a capacitance value of a coupling capacitance formed between a plurality of detection units in a second detection area and the metal ring; or a metal ring is grounded, and a signal transmitting unit applies an excitation signal to the plurality of detection units in the second detection area, so as to detect a capacitance value of a coupling capacitance formed between the plurality of detection units in the second detection area and the metal ring.

Figure 4:
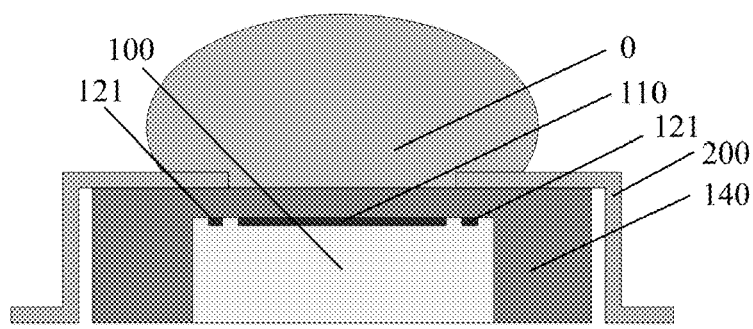
FIG. 4 is a top view of a package structure of a fingerprint detection chip according to an embodiment of the present disclosure.

In embodiments of the present disclosure, as shown in FIG. 4, the fingerprint detection chip 100 has a signal transmitting unit (not shown), a first detection area 110, and the second detection area 120, in which the first detection area 110 has the plurality of detection units (not shown), the second detection area 120 has the plurality of detection units 121, and the first detection area 110 is configured to detect a fingerprint capacitance. The metal ring 200 is located on the fingerprint detection chip 100 and at least partially covers the second detection area 120. The second detection area 120 is an area where the metal ring 200 is longitudinally overlapped with the fingerprint detection chip 100, therefore, the plurality of detection units 121 may be provided in the second detection area 120 and are configured to detect the capacitance value of the coupling capacitance formed among the plurality of detection units 121 in the second detection area 120 and the metal ring 200. In addition, the fingerprint detection chip 100 further includes a plastic package area 140 covering the signal transmitting unit, the first detection area 110 and the second detection area 120.

Figure 5:
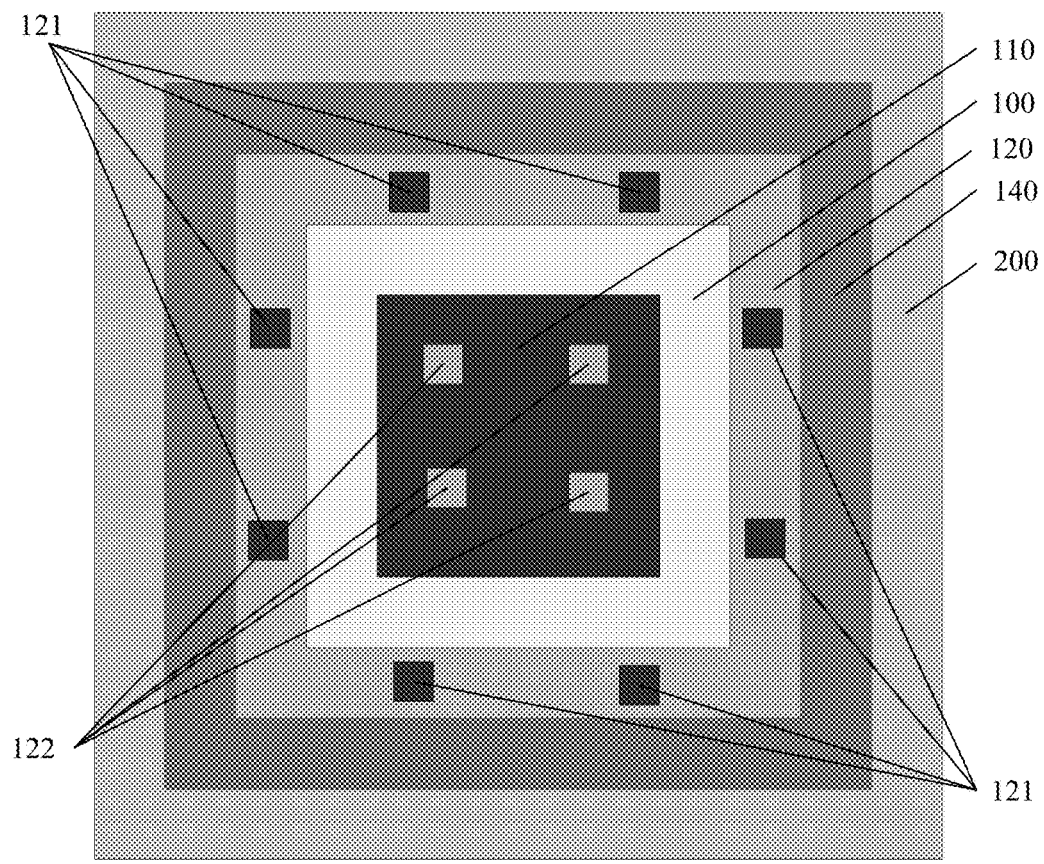
FIG. 5 is a lateral view of a package structure of a fingerprint detection chip according to an embodiment of the present disclosure.

In embodiments of the present disclosure, the first detection area is located at a central area of the fingerprint detection chip and the second detection area surrounds the first detection area. For example, as shown in FIG. 5, 8 detection units 121 are arranged in the second detection area 120. Since the first detection area 110 is a square, the second detection area 120 surrounding the first detection area 110 is a rectangular-ambulatory-plane area and two detection units 121 may be provided in each of the four directions. It should be appreciated that, the detection units 121 may be arranged according to actual applications; the arrangement herein is only an example and should not be limiting.

In embodiments of the present disclosure, there are two ways to detect the capacitance value of the coupling capacitance formed between the plurality of detection units in the second detection area and the metal ring. The first way is a mutual capacitance detection. The signal transmitting unit of the fingerprint detection chip transmits the excitation signal to the metal ring, so as to detect the capacitance value of the coupling capacitance formed between the plurality of detection units in the second detection area and the metal ring. The second way is a self-capacitance detection. The metal ring is grounded, and the signal transmitting unit of the fingerprint detection chip applies the excitation signal to the plurality of detection units in the second detection area, so as to detect the capacitance value of the coupling capacitance formed between the plurality of detection units in the second detection area and the metal ring.

The capacitance value is determined according to a thickness of plastic package. Specifically, the capacitance value C is denoted by a formula $C=\varepsilon S/4\pi kd$, and a relationship between the capacitance value C and the thickness d of plastic package may be obtained from this formula, where c represents a permittivity, k represents an electrostatic force constant, S refers to a unit area of the detection unit of the fingerprint detection chip and is also a constant. Therefore, the capacitance value C can be considered to be inversely proportional to the thickness d of plastic package. That is, the capacitance value corresponding to the area with thicker plastic package is small, and the capacitance value corresponding to the area with thinner plastic package is larger.

S2, an excitation voltage of the first detection area is adjusted according to the capacitance value of the coupling capacitance formed between the plurality of detection units in the second detection area and the metal ring.

In embodiments of the present disclosure, the excitation voltage of the first detection area is kept to be constant if the capacitance value of the coupling capacitance formed between the plurality of detection units in the second detection area and the metal ring is greater than a first preset threshold and less than a second preset threshold; the excitation voltage of the first detection is increased if the capacitance value of the coupling capacitance formed between the plurality of detection units in the second detection area and the metal ring is less than or equal to the first preset threshold; and the excitation voltage of the first detection is decreased if the capacitance value of the coupling capacitance formed between the plurality of detection units in the second detection area and the metal ring is greater than or equal to the second preset threshold. In particular, according to a formula $Q=V*C$, if an electric quantity Q is constant, a voltage V is inversely proportional to a capacitance C. For example, if the capacitance value of the coupling capacitance formed between the plurality of detection units in the second detection area and the metal ring remains between the first preset threshold and the second preset threshold, it indicates that there is no need to adjust the excitation voltage; if the capacitance value of the coupling capacitance formed between the plurality of detection units in the second detection area and the metal ring is less than or equal to the first preset threshold, it needs to increase the excitation voltage; if the capacitance value of the coupling capacitance formed between the plurality of detection units in the second detection area and the metal ring is greater than or equal to the second preset threshold, it needs to decrease the excitation voltage. Finally, the electric quantities obtained by all the detection units are consistent, thereby realizing that all the detection units operate in the desired state.

In an embodiment of the present disclosure, there are multiple capacitance values of the coupling capacitances formed between the plurality of detection units in the second detection area and the metal ring. An average value of the multiple capacitance values is calculated, and then it is compared with the first preset threshold and the second preset threshold for further determining.

After the excitation voltage of the first detection area is increased or decreased, an excitation voltage of the second detection area is increased or decreased correspondingly, and steps S1 and S2 are performed repeatedly until the capacitance value of the coupling capacitance formed between the plurality of detection units in the second detection area and the metal ring is greater than the first preset threshold and less than the second preset threshold.

With the method for adjusting the excitation voltage of a fingerprint detection chip according to embodiments of the present disclosure, by detecting the capacitance value of the coupling capacitance formed between the plurality of detection units in the second detection area and the metal ring and by adjusting the excitation voltage of the first detection area according to the capacitance value of the coupling capacitance, all the detection units of the fingerprint detection chip may operate in the desired state even in the case of non-uniform package thickness, thereby improving efficiency of fingerprint detection, and further enhancing user's experience.

In order to realize the above objective, embodiments of the present disclosure also provide an apparatus for adjusting an excitation voltage of a fingerprint detection chip.

Figure 6:
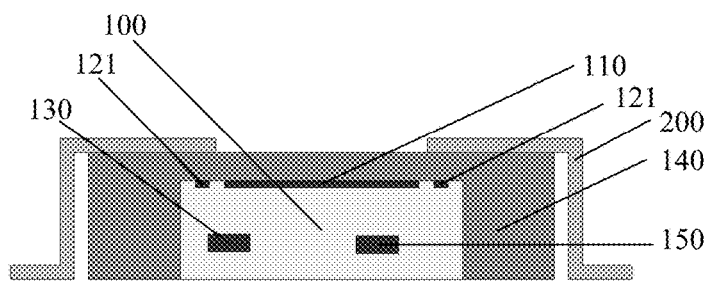
FIG. 6 is a schematic diagram of an apparatus for adjusting an excitation voltage of a fingerprint detection chip according to an embodiment of the present disclosure.

FIG. 6 is a schematic diagram of an apparatus for adjusting an excitation voltage of a fingerprint detection chip according to an embodiment of the present disclosure.

As shown in FIG. 6, the apparatus for adjusting an excitation voltage of a fingerprint detection chip includes the fingerprint detection chip 100, a metal ring 200, and a control module (150).

In embodiments of the present disclosure, the fingerprint detection chip 100 has a signal transmitting unit (130), a first detection area 110, and a second detection area 120, in which the first detection area 110 has a plurality of detection units (122), the second detection area 120 has a plurality of detection units 121, and the first detection area 110 is configured to detect a fingerprint capacitance. The metal ring 200 is located over the fingerprint detection chip 100, and at least partially covers the second detection area 120. As shown in FIG. 4, the second detection area 120 is an area where the metal ring 200 is longitudinally overlapped with the fingerprint detection chip 100 and, therefore, the plurality of detection units 121 may be provided in the second detection area 120 and are configured to detect the capacitance value of the coupling capacitance formed between the plurality of detection units 121 in the second detection area 120 and the metal ring 200. In addition, the fingerprint detection chip 100 further includes a plastic package area 140 covering the signal transmitting unit, the first detection area 110 and the second detection area 120.

In embodiments of the present disclosure, the first detection area 110 is located at a central area of the fingerprint detection chip 100 and the second detection area 120 surrounds the first detection area 110. For example, as shown in FIG. 5, a total of 8 detection units 121 are arranged in the second detection area 120. Since the first detection area 110 is a square, the second detection area 120 surrounding the first detection area 110 is a rectangular-ambulatory-plane area and two detection units 121 may be provided in each of the four directions. It should be appreciated that, the detection units 121 may be arranged according to actual applications and the arrangement herein is only an example and are not limiting.

In embodiments of the present disclosure, there are two ways to detect the capacitance value of the coupling capacitance formed between the plurality of detection units 121 in the second detection area 120 and the metal ring 200. The first way is a mutual capacitance detection. The signal transmitting unit of the fingerprint detection chip 100 transmits the excitation signal to the metal ring 200, so as to detect the capacitance value of the coupling capacitance formed between the plurality of detection units 121 in the second detection area 120 and the metal ring 200. The second way is a self-capacitance detection. The metal ring 200 is grounded, and the signal transmitting unit of the fingerprint detection chip 100 applies the excitation signal to the plurality of detection units 121 in the second detection area 120, so as to detect the capacitance value of the coupling capacitance formed between the plurality of detection units 121 in the second detection area 120 and the metal ring 200.

According to the above two ways, the signal transmitting unit may have two arrangements. The signal transmitting unit may be located on the metal ring 200 so as to be connected to the metal ring 200 during the mutual capacitance detection. The signal transmitting unit may be located on the second detection area 120 so as to apply the excitation signal to the plurality of detection units 121 in the second detection area 120 during the self-capacitance detection. It should be noted that, the signal transmitting unit may be located on any position for transmitting the signal to the plurality of detection units 121 or the metal ring 200, which is not limited herein.

The capacitance value is determined according to a thickness of plastic package. Specifically, the capacitance value C is denoted by a formula $C=\varepsilon S/4\pi kd$, and a relationship between the capacitance value C and the thickness d of plastic package may be obtained from this formula, where c represents a permittivity, k represents an electrostatic force constant, S refers to a unit area of the detection unit of the fingerprint detection chip and is also a constant. Therefore, the capacitance value C can be considered to be inversely proportional to the thickness d of plastic package. That is, the capacitance value corresponding to the area with thicker plastic package is small, and the capacitance value corresponding to the area with thinner plastic package is large.

The control module is configured to adjust an excitation voltage of the first detection area 110 according to the capacitance value of the coupling capacitance formed between the plurality of detection units 121 in the second detection area 120 and the metal ring 200.

In an embodiment of the present disclosure, if the control module determines that the capacitance value of the coupling capacitance formed between the plurality of detection units 121 in the second detection area 120 and the metal ring 200 is greater than a first preset threshold and less than a second preset threshold, it keeps the excitation voltage of the first detection area to be constant; if the control module determines that the capacitance value of the coupling capacitance formed between the plurality of detection units 121 in the second detection area 120 and the metal ring 200 is less than or equal to the first preset threshold, it increases the excitation voltage of the first detection area; and if the control module determines that the capacitance value of the coupling capacitance formed between the plurality of detection units 121 in the second detection area 120 and the metal ring 200 is greater than or equal to the second preset threshold, it decreases the excitation voltage of the first detection area.

In particular, according to a formula $Q=V*C$, if an electric quantity Q is constant, a voltage V is inversely proportional to a capacitance C. For example, if the capacitance value of the coupling capacitance formed between the plurality of detection units 121 in the second detection area 120 and the metal ring 200 remains between the first preset threshold and the second preset threshold, it indicates that there is no need to adjust the excitation voltage; if the capacitance value of the coupling capacitance formed between the plurality of detection units 121 in the second detection area 120 and the metal ring 200 is less than or equal to the first preset threshold, it needs to increase the excitation voltage; if the capacitance value of the coupling capacitance formed between the plurality of detection units 121 in the second detection area 120 and the metal ring 200 is greater than or equal to the second preset threshold, it needs to decrease the excitation voltage. Finally, the electric quantities obtained by all the detection units are consistent, thereby realizing that all the detection units operate in the desired state.

In an embodiment of the present disclosure, there are multiple capacitance values of the coupling capacitances formed between the plurality of detection units 121 in the second detection area 120 and the metal ring 200. An average value of the multiple capacitance values is calculated, and then it is compared with the first preset threshold and the second preset threshold for further determining.

After the excitation voltage of the first detection area 110 is increased or decreased, an excitation voltage of the second detection area 120 is increased or decreased correspondingly, and the capacitance value of the coupling capacitance formed between the plurality of detection units 121 in the second detection area 120 and the metal ring 200 is detected and the excitation voltage of the first detection area 110 is adjusted according to the capacitance value of the coupling capacitance formed between the plurality of detection units 121 in the second detection area 120 and the metal ring 200 repeatedly until the capacitance value of the coupling capacitance formed between the plurality of detection units 121 in the second detection area 120 and the metal ring 200 is greater than the first preset threshold and less than the second preset threshold.

With the apparatus for adjusting an excitation voltage of a fingerprint detection chip according to embodiments of the present disclosure, by detecting the capacitance value of the coupling capacitance formed between the plurality of detection units in the second detection area and the metal ring and by adjusting the excitation voltage of the first detection area according to the capacitance value of the coupling capacitance, all the detection units of the fingerprint detection chip may operate in the desired state in the case of non-uniform package thickness, thereby improving efficiency of fingerprint detection, and further enhancing user's experience.

Figure 7:
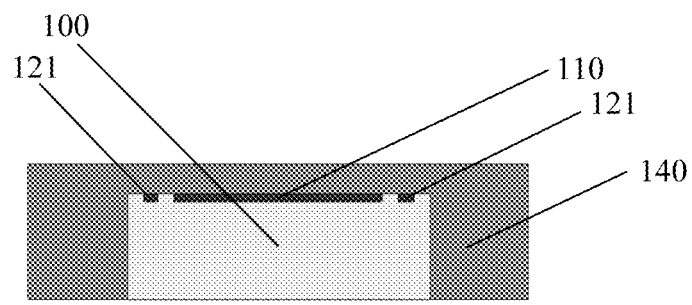
FIG. 7 is a schematic diagram of a fingerprint detection chip according to an embodiment of the present disclosure.

Embodiments of the present disclosure further provide a fingerprint detection chip. FIG. 7 is a schematic diagram of a fingerprint detection chip according to an embodiment of the present disclosure.

As shown in FIG. 7, the fingerprint detection chip 100 includes a signal transmitting unit (not shown), a first detection area 110, and a second detection area 120. The first detection area 110 has a plurality of detection units and the second detection area 120 has a plurality of detection units 121, and the first detection area 110 is configured to detect a fingerprint capacitance.

A metal ring 200 is located on the fingerprint detection chip 100, and at least partially covers the second detection area 120. As shown in FIG. 4, the second detection area 120 is an area where the metal ring 200 is longitudinally overlapped with the fingerprint detection chip 100, therefore, the plurality of detection units 121 may be provided in the second detection area 120 and are configured to detect the capacitance value of the coupling capacitance formed between the plurality of detection units 121 in the second detection area 120 and the metal ring 200. In addition, the fingerprint detection chip 100 further includes a plastic package area 140 covering the signal transmitting unit 130, the first detection area 110 and the second detection area 120.

In embodiments of the present disclosure, the first detection area 110 is located at a central area of the fingerprint detection chip 100 and the second detection area 120 surrounds the first detection area 110. For example, as shown in FIG. 5, a total of 8 detection units 121 are arranged in the second detection area 120. Since the first detection area 110 is a square, the second detection area 120 surrounding the first detection area 110 is a rectangular-ambulatory-plane area and two detection units 121 may be provided in each of the four directions. It should be appreciated that, the detection units 121 may be arranged according to actual applications and the arrangement herein is only an example herein and should not be construed as limiting.

In embodiments of the present disclosure, there are two ways to detect the capacitance value of the coupling capacitance formed between the plurality of detection units 121 in the second detection area 120 and the metal ring 200. The first way is a mutual capacitance detection. The signal transmitting unit of the fingerprint detection chip 100 transmits the excitation signal to the metal ring 200, so as to detect the capacitance value of the coupling capacitance formed between the plurality of detection units 121 in the second detection area 120 and the metal ring 200. The second way is a self-capacitance detection. The metal ring 200 is grounded, and the signal transmitting unit of the fingerprint detection chip 100 applies the excitation signal to the plurality of detection units 121 in the second detection area 120, so as to detect the capacitance value of the coupling capacitance formed between the plurality of detection units 121 in the second detection area 120 and the metal ring 200.

The capacitance value is determined according to a thickness of plastic package. Specifically, the capacitance value C is denoted by a formula $C=\varepsilon S/4\pi k d$, and a relationship between the capacitance value C and the thickness d of plastic package may be obtained from this formula, where $\varepsilon$ represents a permittivity, k represents an electrostatic force constant, S refers to a unit area of the detection unit of the fingerprint detection chip and is also a constant. Therefore, the capacitance value C can be considered to be inversely proportional to the thickness d of plastic package. That is, the capacitance value corresponding to the area with thicker plastic package is smaller, and the capacitance value corresponding to the area with thinner plastic package is larger.

With the fingerprint detection chip according to embodiments of the present disclosure, by detecting the capacitance value of the coupling capacitance formed between the plurality of detection units in the second detection area and the metal ring and by adjusting the excitation voltage of the first detection area according to the capacitance value of the coupling capacitance, all the detection units of the fingerprint detection chip may operate in the desired state in the case of non-uniform package thickness, thereby improving efficiency of fingerprint detection, and further enhancing user's experience.

In the specification, unless specified or limited otherwise, relative terms such as "central", "longitudinal", "lateral", "front", "rear", "right", "left", "inner", "outer", "lower", "upper", "horizontal", "vertical", "above", "below", "up", "top", "bottom" as well as derivative thereof (e.g., "horizontally", "downwardly", "upwardly", etc.) should be construed to refer to the orientation as then described or as shown in the drawings under discussion. These relative terms are for convenience of description and do not require that the present disclosure be constructed or operated in a particular orientation.

In addition, terms such as "first" and "second" are used herein for purposes of description and are not intended to indicate or imply relative importance or significance. Thus, the feature defined with "first" and "second" may comprise one or more this feature. In the description of the present disclosure, "a plurality of" means two or more, unless specified otherwise.

In the description of the present disclosure, it should be understood that, unless specified or limited otherwise, the terms "mounted," "connected," "coupled" and "fixed" and variations thereof are used broadly and encompass such as mechanical or electrical mountings, connections and couplings, also can be inner mountings, connections and couplings of two components, and further can be direct and indirect mountings, connections, and couplings, which can be understood by those skilled in the art according to the detail embodiment of the present disclosure.

In the description of the present disclosure, a structure in which a first feature is "on" a second feature may include an embodiment in which the first feature directly contacts the second feature, and may also include an embodiment in which an additional feature is formed between the first feature and the second feature so that the first feature does not directly contact the second feature, unless specified otherwise. Furthermore, a first feature "on," "above," or "on top of" a second feature may include an embodiment in which the first feature is right "on," "above," or "on top of" the second feature, and may also include an embodiment in which the first feature is not right "on," "above," or "on top of" the second feature, or just means that the first feature is at a height higher than that of the second feature. While a first feature "beneath," "below," or "on bottom of" a second feature may include an embodiment in which the first feature is right "beneath," "below," or "on bottom of" the second feature, and may also include an embodiment in which the first feature is not right "beneath," "below," or "on bottom of" the second feature, or just means that the first feature is at a height lower than that of the second feature.

Reference throughout this specification to "an embodiment," "some embodiments," "one embodiment", "another example," "an example," "a specific example," or "some examples," means that a particular feature, structure, material, or characteristic described in connection with the embodiment or example is included in at least one embodiment or example of the present disclosure. Thus, the appearances of the phrases such as "in some embodiments," "in one embodiment", "in an embodiment", "in another example," "in an example," "in a specific example," or "in some examples," in various places throughout this specification are not necessarily referring to the same embodiment or example of the present disclosure. Furthermore, the particular features, structures, materials, or characteristics may be combined in any suitable manner in one or more embodiments or examples.

Although explanatory embodiments have been shown and described, it would be appreciated by those skilled in the art that the above embodiments cannot be construed to limit the present disclosure, and changes, alternatives, and modifications can be made in the embodiments without departing from spirit, principles and scope of the present disclosure.

What is claimed is:

1. A method for adjusting an excitation voltage of a fingerprint detection chip, wherein the fingerprint detection chip has a signal transmitting unit, a first detection area, and a second detection area, each of the first detection area and the second detection area has a plurality of detection units, the first detection area is configured to detect a fingerprint capacitance, a metal ring is located over the fingerprint detection chip, and the metal ring at least partially covers the second detection area, the method comprising:
    S1, transmitting an excitation signal to the metal ring, by the signal transmitting unit, so as to detect a capacitance value of a coupling capacitance formed between the plurality of detection units in the second detection area and the metal ring; or
    grounding the metal ring and applying the excitation signal to the plurality of detection units in the second detection area, by the signal transmitting unit, so as to detect a capacitance value of a coupling capacitance formed between the plurality of detection units in the second detection area and the metal ring; and
    S2, adjusting the excitation voltage of the excitation signal of the first detection area according to the capacitance value of the coupling capacitance formed between the plurality of detection units in the second detection area and the metal ring.

2. The method according to claim 1, wherein adjusting the excitation voltage of the excitation signal of the first detection area according to the capacitance value of the coupling capacitance formed between the plurality of detection units in the second detection area and the metal ring comprises:
    when the capacitance value of the coupling capacitance formed between the plurality of detection units in the second detection area and the metal ring is greater than a first preset threshold and less than a second preset threshold, keeping the excitation voltage of the excitation signal of the first detection area to be constant;
    when the capacitance value of the coupling capacitance formed between the plurality of detection units in the second detection area and the metal ring is less than or equal to the first preset threshold, increasing the excitation voltage of the excitation signal of the first detection area; and
    when the capacitance value of the coupling capacitance formed between the plurality of detection units in the second detection area and the metal ring is greater than or equal to the second preset threshold, decreasing the excitation voltage of the excitation signal of the first detection area.

3. The method according to claim 2, wherein determining the capacitance value of the coupling capacitance formed between the plurality of detection units in the second detection area and the metal ring comprises:
    calculating an average value of capacitance values of coupling capacitances formed between the plurality of detection units and the metal ring.

4. The method according to claim 1, wherein the first detection area is located at a central area of the fingerprint detection chip and the second detection area surrounds the first detection area.

5. The method according to claim 1, wherein transmitting an excitation signal to the metal ring, by the signal transmitting unit, so as to detect a capacitance value of a coupling capacitance formed between the plurality of detection units in the second detection area and the metal ring comprises:
    transmitting the excitation signal to the metal ring, by the signal transmitting unit, when the signal transmitting unit is connected with the metal ring, so as to detect the capacitance value of the coupling capacitance formed between the plurality of detection units in the second detection area and the metal ring;
    wherein enabling the metal ring grounded, and applying the excitation signal to the plurality of detection units in the second detection area by the signal transmitting unit, so as to detect a capacitance value of a coupling capacitance formed between the plurality of detection units in the second detection area and the metal ring comprises:
    grounding the metal ring when the signal transmitting unit is integrated in the first detection area or the second detection area and applying the excitation signal to the plurality of detection units in the second detection area by the signal transmitting unit, so as to detect the capacitance value of the coupling capacitance formed between the plurality of detection units in the second detection area and the metal ring.

6. The method according to claim 5, wherein the fingerprint detection chip further comprises a plastic package area covering the signal transmitting unit, the first detection area and the second detection area.

7. The method according to claim 6, after increasing or decreasing the excitation voltage of the excitation signal of the first detection area, the method further comprising:
    increasing or decreasing the excitation voltage of the excitation signal of the second detection area correspondingly, and repeating S1 and S2 until the capacitance value of the coupling capacitance formed between the plurality of detection units in the second detection area and the metal ring is greater than the first preset threshold and less than the second preset threshold.

8. An apparatus for adjusting an excitation voltage of a fingerprint detection chip, comprising:
    a fingerprint detection chip, wherein the fingerprint detection chip comprises a first detection area, and a second detection area, each of the first detection area and the second detection area has a plurality of detection units, and the first detection area is configured to detect a fingerprint capacitance;
    a metal ring located on the fingerprint detection chip, wherein the metal ring at least partially covers the second detection area;

a signal transmitting unit, configured to transmit an excitation signal to the metal ring, so as to detect a capacitance value of a coupling capacitance formed between the plurality of detection units in the second detection area and the metal ring; or configured to apply the excitation signal to the plurality of detection units in the second detection area when the metal ring is grounded, so as to detect a capacitance value of a coupling capacitance formed between the plurality of detection units in the second detection area and the metal ring; and a control module, configured to adjust the excitation voltage of the excitation signal of the first detection area according to the capacitance value of the coupling capacitance formed between the plurality of detection units in the second detection area and the metal ring.

9. The apparatus according to claim 8, wherein the control module is further configured to:

when it is determined that the capacitance value of the coupling capacitance formed between the plurality of detection units in the second detection area and the metal ring is greater than a first preset threshold and less than a second preset threshold, keep the excitation voltage of the excitation signal of the first detection area to be constant;

when it is determined that the capacitance value of the coupling capacitance formed between the plurality of detection units in the second detection area and the metal ring is less than or equal to the first preset threshold, increase the excitation voltage of the excitation signal of the first detection area; and when it is determined that the capacitance value of the coupling capacitance formed between the plurality of detection units in the second detection area and the metal ring is greater than or equal to the second preset threshold, decrease the excitation voltage of the excitation signal of the first detection area.

10. The apparatus according to claim 8, wherein the control module is further configured to:

adjust the excitation voltage of the excitation signal of the first detection area according to an average value of capacitance values of coupling capacitances formed between the plurality of detection units and the metal ring.

11. The apparatus according to claim 8, wherein the first detection area is located at a central area of the fingerprint detection chip and the second detection area surrounds the first detection area.

12. The apparatus according to claim 8, wherein:

the signal transmitting unit is configured to transmit the excitation signal to the metal ring when the signal transmitting unit is connected with the metal ring, so as to detect the capacitance value of the coupling capacitance formed between the plurality of detection units in the second detection area and the metal ring;

the signal transmitting unit is configured to apply the excitation signal to the plurality of detection units in the second detection area when the signal transmitting unit is integrated in the first detection area or the second detection area, and the metal ring is grounded, so as to detect the capacitance value of the coupling capacitance formed between the plurality of detection units in the second detection area and the metal ring.

13. The apparatus according to claim 8, wherein the fingerprint detection chip further comprises a plastic package area covering the signal transmitting unit, the first detection area and the second detection area.

14. The apparatus according to claim 13, wherein after increasing or decreasing the excitation voltage of the excitation signal of the first detection area, the control module is further configured to increase or decrease the excitation voltage of the excitation signal of the second detection area correspondingly, to repeatedly detect the capacitance value of the coupling capacitance formed between the plurality of detection units in the second detection area and the metal ring and adjust the excitation voltage of the excitation signal of the first detection area according to the capacitance value of the coupling capacitance formed between the plurality of detection units in the second detection area and the metal ring until the capacitance value of the coupling capacitance formed between the plurality of detection units in the second detection area and the metal ring is greater than the first preset threshold and less than the second preset threshold.

15. A fingerprint detection chip, comprising a signal transmitting unit, a first detection area and a second detection area, wherein:

each of the first detection area and the second detection area has a plurality of detection units, the first detection area is configured to detect a fingerprint capacitance;

the signal transmitting unit is configured to transmit an excitation signal to a metal ring, so as to detect a capacitance value of a coupling capacitance formed between the plurality of detection units in the second detection area and the metal ring; or configured to apply the excitation signal to the plurality of detection units in the second detection area when the metal ring is grounded, so as to detect a capacitance value of a coupling capacitance formed between the plurality of detection units in the second detection area and the metal ring;

the metal ring is located on the fingerprint detection chip and at least partially covers the second detection area.

16. The fingerprint detection chip according to claim 15, wherein the signal transmitting unit is configured to transmit the excitation signal to the metal ring when the signal transmitting unit is connected with the metal ring, so as to detect the capacitance value of the coupling capacitance formed between the plurality of detection units in the second detection area and the metal ring;

the signal transmitting unit is configured to apply the excitation signal to the plurality of detection units in the second detection area when the signal transmitting unit is integrated in the first detection area or the second detection area, and the metal ring is grounded, so as to detect the capacitance value of the coupling capacitance formed between the plurality of detection units in the second detection area and the metal ring.

17. The fingerprint detection chip according to claim 16, further comprising a plastic package area covering the signal transmitting unit, the first detection area and the second detection area.

* * * * *